United States Patent
Yeung et al.

(10) Patent No.: US 8,963,609 B2
(45) Date of Patent: Feb. 24, 2015

(54) COMBINATORIAL CIRCUIT AND METHOD OF OPERATION OF SUCH A COMBINATORIAL CIRCUIT

(71) Applicant: ARM Limited, Cambridge (GB)

(72) Inventors: Gus Yeung, Austin, TX (US);
Srinivasan Srinath, Bangalore (IN);
Fakhruddin Ali Bohra, Bangalore (IN)

(73) Assignee: ARM Limited, Cambridge (GB)

( * ) Notice: Subject to any disclaimer, the term of this patent is extended or adjusted under 35 U.S.C. 154(b) by 39 days.

(21) Appl. No.: 13/782,120

(22) Filed: Mar. 1, 2013

(65) Prior Publication Data

US 2014/0247081 A1    Sep. 4, 2014

(51) Int. Cl.
*H03L 5/00*    (2006.01)

(52) U.S. Cl.
USPC .............................................. 327/333; 326/68

(58) Field of Classification Search
USPC ........................... 326/63, 68, 80, 81; 327/333
See application file for complete search history.

(56) References Cited

U.S. PATENT DOCUMENTS

| | | | | |
|---|---|---|---|---|
| 5,019,727 A * | 5/1991 | Kusaba | ......................... | 326/108 |
| 5,508,640 A * | 4/1996 | Partovi et al. | ................... | 326/98 |
| 6,249,145 B1 * | 6/2001 | Tanaka et al. | .................... | 326/68 |
| 6,433,583 B1 * | 8/2002 | Micheloni et al. | .............. | 326/80 |
| 6,501,306 B1 * | 12/2002 | Kim et al. | ...................... | 327/112 |
| 6,563,357 B1 | 5/2003 | Hsu et al. | | |
| 6,770,941 B2 * | 8/2004 | Shinozaki et al. | ............. | 257/369 |
| 7,180,329 B1 * | 2/2007 | Sia et al. | ........................... | 326/81 |
| 7,352,209 B2 * | 4/2008 | Hsu et al. | ......................... | 326/81 |
| 7,777,522 B2 * | 8/2010 | Yang et al. | ...................... | 326/68 |
| 7,880,500 B2 * | 2/2011 | Monk | .............................. | 326/68 |
| 2007/0217280 A1 | 9/2007 | Kumala | | |
| 2008/0157848 A1 | 7/2008 | Yeung | | |
| 2012/0001673 A1 | 1/2012 | Hurrell | | |

FOREIGN PATENT DOCUMENTS

| | | |
|---|---|---|
| EP | 0 741 459 | 11/1996 |
| GB | 2482044 | 1/2012 |
| WO | WO 2013/074073 | 5/2013 |

OTHER PUBLICATIONS

GB Search Report dated Jul. 16, 2014 in GB 1400925.2, 4 pages.

* cited by examiner

*Primary Examiner* — Quan Tra
(74) *Attorney, Agent, or Firm* — Nixon & Vanderhye P.C.

(57) ABSTRACT

An integrated level shifting combinatorial circuit receives a plurality of input signals in a first voltage domain and performs a combinatorial operation to generate an output signal in a second voltage domain. The circuit includes combinatorial circuitry includes first and second combinatorial circuit portions operating in respective first and second voltage domains. The second combinatorial circuit portion has an output node whose voltage level identifies a value of the output signal and includes feedback circuitry which applies a level shifting function to an intermediate signal generated by the first combinatorial circuit portion. A contention mitigation circuitry reduces a voltage drop across at least one component within the feedback circuitry in situations when the combinatorial circuitry's performance of the combinatorial operation causes the combinatorial circuitry to switch the voltage on the output node, the contention mitigation circuitry thereby assists the combinatorial circuitry in the output node voltage switching.

15 Claims, 7 Drawing Sheets

COMBINATORIAL CIRCUIT AND METHOD OF OPERATION OF SUCH A COMBINATORIAL CIRCUIT

BACKGROUND OF THE INVENTION

1. Field of the Invention

The present invention relates to a combinatorial circuit for performing a combinatorial operation using a plurality of inputs signals in order to generate an output signal, and in particular to such a circuit for use in situations where a level shifting function also needs to be applied to the output signal.

2. Description of the Prior Art

A level shifter circuit is used when there is a need to pass signals from one voltage domain to a different voltage domain. In modern data processing systems, it is becoming more and more common for certain parts of the data processing system to operate in a different voltage domain to one or more other parts of the data processing system. For example, a trend within integrated circuits is the increasingly common use of embedded memory, such as SRAM memory. With the reduction in size of process geometries, the individual memory cells within the memory are becoming less stable. To reduce the power consumption of the integrated circuit, it is desirable to reduce the operating voltage of the components within the integrated circuit. However, whilst this can be done for many of the components within the integrated circuit, including access logic circuitry associated with the memory device, it is often the case that a higher voltage is needed to drive the array of memory cells within the memory device in order to enhance the stability of those cells. Hence, embedded SRAM bit cells may use a higher voltage supply to guarantee state retention, whilst the rest of the system, including the access logic circuitry employed to access those bit cells within the memory device, may use a lower voltage supply to reduce power consumption. In order to maintain performance, and reduce switching power, level shifters are provided to pass signals between these domains.

It is often the case that combinatorial circuits will exist in regions of the integrated circuit where signals are to be passed between different voltage domains. Combinatorial circuits can take a variety of forms, for example adders, subtractors, multiplexers, demultiplexers, encoders, decoders, etc. Such circuits produce an output signal which is a pure function of the presented input signals. Considering the earlier example of a voltage domain transition between the access logic circuitry of the memory device operating in a lower voltage domain, and the actual bit cells of the memory device operating in a higher voltage domain, an example of such a combinatorial circuit is a word line driver circuit used to generate a word line signal associated with a row of bit cells within the memory array. Such a word line driver circuit operates as a decoder to determine, based on a plurality of input signals, whether to assert the word line signal. An example of a known word line driver circuit is illustrated in FIG. 1.

As can be seen from FIG. 1, the word line driver circuit basically consists of a NAND gate formed by a plurality of PMOS transistors 4, 5, 6 in parallel, and a stack of NMOS transistors 1, 2, 3, with the output of the NAND gate then passed through an inverter formed by a PMOS transistor 8 in series with an NMOS transistor 7. In the example of FIG. 1, it is assumed that both the NAND gate and the inverter operate in the higher voltage domain, receiving a supply voltage VDDC associated with that higher voltage domain. However, it is assumed that the input signals A and B, and typically also the clock signal CK, are generated by components in the low voltage domain.

As will be understood by those skilled in the art, pre-decode circuitry forming part of the access logic circuitry of the memory device will typically receive an address, and perform a number of pre-decode operations in order to generate two data bits provided to each word line driver circuit, these data bits being indicated in FIG. 1 as the signals A and B. If both of these bits are asserted at a logic one value, then during a particular phase of the clock signal the word line driver circuit is arranged to assert the word line signal. In the example of FIG. 1, the predetermined phase of the clock signal is the logic one phase. Accordingly, if both of the signals A and B are asserted at a logic one level in the lower voltage domain, they will turn on the NMOS transistors 2, 3, and when the clock signal is also high, turning on the NMOS transistor 1, this will cause the output of the NAND gate to transition to a logic zero level, since all of the PMOS transistors 4, 5, 6 will at this stage be turned off. The operation of the inverter will then cause a logic one value to be asserted on the word line, this logic one value being at the high voltage VDDC.

Hence, it can be seen that the circuitry of FIG. 1 can perform level shifting whilst also decoding the input signals in order to generate the required word line signal. However, it should be noted that because the signals A and B (and optionally also the clock signal CK) are generated in the low voltage domain, then during the scenario discussed above, the NMOS transistors will not be fully turned on, and also the PMOS transistors within the NAND gate will not be fully turned off. Accordingly, as the voltage difference between the lower voltage domain and the higher voltage domain increases, this will increase the latency of operation of the NAND gate, and hence impact performance. As the voltage difference increases still further, this can result in the failure of the word line driver circuitry, and accordingly the circuitry of FIG. 1 can only be used in situations where there is a relatively small voltage difference between the lower voltage domain and the higher voltage domain.

Also shown in FIG. 1 is a PMOS control header transistor 9, which can be used to reduce leakage through the inverter during periods of time where the word line driver circuitry is not being used. In particular, in this example, it is assumed that the chip enable (CEN) signal is asserted at a logic zero level when the portion of the SRAM memory connected to the wordline is active, hence turning on the transistor 9 and connecting the inverter to the VDDC supply. Conversely, when the chip enable signal is de-asserted at a logic one value, this turns off the PMOS transistor 9, hence avoiding leakage current being drawn through the inverter.

Whilst the word line driver circuitry of FIG. 1 offers a suitable solution when the voltage difference between the lower voltage domain and the higher voltage domain is relatively small, the voltage differences are becoming larger and larger in modern data processing systems. For example, the difference in voltage between the lower voltage domain and the higher voltage domain can be as larger as 400 mV when taking into account power supply tolerance variation and IR drop. With such large differences between the two voltage domains, the word line driver circuitry of FIG. 1 cannot be used.

Commonly owned co-pending patent application US 2008/0157848 A1, the entire contents of which are hereby incorporated by reference, describes a level shifting circuit for use between voltage domains which is able to operate efficiently even when there is a relatively large voltage difference between the lower voltage domain and the higher voltage domain. Hence, an input signal provided to that level shifting circuit can be upshifted to a significantly higher voltage domain. Accordingly, one possible approach would be to operate the word line driver circuitry entirely in the lower voltage domain, and then use such a level shifting circuit as described in the above patent application to boost the output signal to the higher voltage domain. However, such an approach would be have a significant performance impact, and would also have a relatively large power consumption, due to the presence of the two separate circuits.

Accordingly, it would be desirable to provide an improved circuit for performing combinatorial operations, such as the above described decoding operation, whilst also allowing a larger voltage level shifting range to be accommodated.

SUMMARY OF THE INVENTION

Viewed from a first aspect, the present invention provides an integrated level shifting combinatorial circuit for receiving a plurality of input signals in a first voltage domain and performing a combinatorial operation to generate an output signal in a second voltage domain, said first voltage domain operating with a first voltage supply providing a first voltage level and a common voltage level and said second voltage domain operating with a second voltage supply providing a second voltage level and said common voltage level, said integrated level shifting combinatorial circuit comprising: combinatorial circuitry configured to receive said plurality of input signals and to perform the combinatorial operation, the combinatorial circuitry comprising a first combinatorial circuit portion operating in said first voltage domain and a second combinatorial circuit portion operating in said second voltage domain, the second combinatorial circuit portion having an output node whose voltage level identifies a value of the output signal; said second combinatorial circuit portion including feedback circuitry configured to apply a level shifting function to an intermediate signal generated by said first combinatorial circuit portion; and contention mitigation circuitry operating in said second voltage domain and configured, when the combinatorial circuitry's performance of the combinatorial operation based on the received input signals causes the combinatorial circuitry to transition the voltage on said output node between said second voltage level and said common voltage level, to reduce a voltage drop across at least one component within the feedback circuitry, thereby assisting said combinatorial circuitry in transitioning the voltage on said output node.

In accordance with the present invention, the combinatorial circuitry is split such that a first combinatorial circuit portion is provided in the first voltage domain and a second combinatorial circuit portion is provided in the second voltage domain, the second combinatorial circuit portion including feedback circuitry configured to apply a level shifting function. Further, contention mitigation circuitry is provided that operates in the second voltage domain, and in situations where the combinatorial circuitry is seeking to switch the voltage on the output node, the contention mitigation circuitry reduces a voltage drop across at least one component within the feedback circuitry, thus assisting the combinatorial circuitry in performing the switch of the voltage on the output node.

By virtue of this approach, the level shifting functionality is integrated within the combinatorial circuit and can provide a large range level shifting function with low power consumption. In particular, the solution provides significantly improved performance than would be the case if a traditional combinatorial circuit were provided, followed by a separate level shifting circuit. In addition, the integrated level shifting combinatorial circuit of the present invention has significantly lower static circuit power consumption when compared with the known prior art (such as the circuitry of FIG. 1 where various of the transistors are not completely switched off, and hence contribute to an increase in the power consumption).

In one embodiment, the contention mitigation circuitry includes part of the second combinatorial circuit portion. This provides a particularly performance efficient solution since that part of the second combinatorial circuit portion hence contributes both to the performance of the combinatorial operation, and the contention mitigation functionality of the contention mitigation circuitry.

In one embodiment, a difference between the second voltage level and the common voltage level is higher than a difference between the first voltage level and the common voltage level. The techniques of the described embodiments are particularly beneficially applied when transitioning from a lower voltage domain to a higher voltage domain.

The combinatorial circuitry can be arranged to perform a variety of different combinatorial operations. However, in one embodiment the combinatorial circuitry performs a decoding operation. In one specific example, the integrated level shifting combinatorial circuit is used as a word line driver circuit, such that the output signal forms a word line driver signal for a row of memory cells within a memory array.

The plurality of input signals can take a variety of forms. However, in one embodiment the plurality of input signals includes a clock signal used to qualify the remaining input signals in said plurality, such that performance of the combinatorial operation by the combinatorial circuitry only enables the output signal to be set to an asserted value when the clock signal is in a predetermined phase.

In one particular embodiment the asserted value is indicated by the output node being at the second voltage level, and the predetermined phase of the clock signal occurs when the clock signal is at a logic 1 level.

The contention mitigation circuitry can be configured to operate in a variety of ways. However, in one embodiment the second combinatorial circuit portion includes an inverter circuit whose output forms the output node, and the contention mitigation circuitry comprises transistor circuitry located between the inverter circuit and one of said second voltage level and said common voltage level, the transistor circuitry receiving at a gate terminal a signal generated by the first combinatorial circuit portion in the first voltage domain. In one particular embodiment the above-mentioned transistor circuitry comprises PMOS transistor circuitry located between the inverter circuit and the second voltage level.

With such an arrangement of contention mitigation circuitry, the contention mitigation circuitry can assist in transitioning of the output node from the second voltage level to the common voltage level. In particular, when the combinatorial circuitry's performance of the combinatorial operation based on the received input signals causes the combinatorial circuitry to transition the voltage on said output node from said second voltage level to said common voltage level, said PMOS transistor circuitry of the contention mitigation circuitry is driven by a logic 1 signal from said first voltage domain which causes the PMOS transistor circuitry to present a resistive path reducing the voltage across a pull-up component within the inverter circuit. This pull-up component within the inverter circuit also forms part of the earlier mentioned feedback circuitry.

Such a configuration also has the added benefit that there is no longer a requirement to provide a control header such as was required in the circuitry of FIG. 1 to reduce leakage current in the non-active mode of operation, since the contention mitigation circuitry will inherently provide that leakage current reduction functionality in such situations.

There are a number of ways in which the logic one signal from the first voltage domain can be generated for provision to the PMOS transistor circuitry of the above described contention mitigation circuitry. In one embodiment, the first combinatorial circuit portion includes a NAND gate circuit configured to generate said logic 1 signal from said first voltage domain, said NAND gate circuit additionally configured to provide said logic 1 signal to a pull-down component within the inverter circuit.

As mentioned earlier, in one embodiment part of the second combinatorial circuit portion is included within the contention mitigation circuitry. In one particular embodiment, this part of the second combinatorial circuit portion comprises a plurality of PMOS transistor circuits arranged in parallel, each PMOS transistor circuit receiving an associated one of the input signals from the first voltage domain.

Such an arrangement of contention mitigation circuitry can assist the combinatorial circuitry in situations where it is necessary to transition the voltage on the output node from the common voltage level to the second voltage level. In particular, when the combinatorial circuitry's performance of the combinatorial operation based on the received input signals causes the combinatorial circuitry to transition the voltage on said output node from said common voltage level to said second voltage level, said plurality of PMOS transistor circuits of the contention mitigation circuitry are driven by logic 1 signals from said first voltage domain which cause the plurality of PMOS transistor circuits to present a resistive path reducing the voltage across a pull-up component within the feedback circuitry. This provides a particularly efficient solution, since not only is the transition of the output assisted by the contention mitigation circuitry, but the contention mitigation circuitry also performs a required part of the combinatorial operation.

The first combinatorial circuit portion can take a variety of forms. In one embodiment, it comprises a stack of NMOS transistor circuits, each NMOS transistor in the stack configured to receive an associated one of said input signals.

Viewed from a second aspect, the present invention provides a method of operating an integrated level shifting combinatorial circuit configured to receive a plurality of input signals in a first voltage domain and to perform a combinatorial operation to generate an output signal in a second voltage domain, said first voltage domain operating with a first voltage supply providing a first voltage level and a common voltage level and said second voltage domain operating with a second voltage supply providing a second voltage level and said common voltage level, said method comprising: employing combinatorial circuitry to receive said plurality of input signals and to perform the combinatorial operation, the combinatorial circuitry comprising a first combinatorial circuit portion operating in said first voltage domain and a second combinatorial circuit portion operating in said second voltage domain, the second combinatorial circuit portion having an output node whose voltage level identifies a value of the output signal; employing feedback circuitry within said second combinatorial circuit portion to apply a level shifting function to an intermediate signal generated by said first combinatorial circuit portion; and employing contention mitigation circuitry operating in said second voltage domain, when the combinatorial circuitry's performance of the combinatorial operation based on the received input signals causes the combinatorial circuitry to transition the voltage on said output node between said second voltage level and said common voltage level, to reduce a voltage drop across at least one component within the feedback circuitry, thereby assisting said combinatorial circuitry in transitioning the voltage on said output node.

Viewed from a third aspect, the present invention provides an integrated level shifting combinatorial circuit for receiving a plurality of input signals in a first voltage domain and performing a combinatorial operation to generate an output signal in a second voltage domain, said first voltage domain operating with a first voltage supply providing a first voltage level and a common voltage level and said second voltage domain operating with a second voltage supply providing a second voltage level and said common voltage level, said integrated level shifting combinatorial circuit comprising: combinatorial means for receiving said plurality of input signals and for performing the combinatorial operation, the combinatorial means comprising a first combinatorial circuit portion means for operating in said first voltage domain and a second combinatorial circuit portion means for operating in said second voltage domain, the second combinatorial circuit portion means having an output node whose voltage level identifies a value of the output signal; said second combinatorial circuit portion means including feedback means for applying a level shifting function to an intermediate signal generated by said first combinatorial circuit portion means; and contention mitigation means for operating in said second voltage domain and for reducing a voltage drop across at least one component within the feedback means when performance by the combinatorial means of the combinatorial operation based on the received input signals causes the combinatorial means to transition the voltage on said output node between said second voltage level and said common voltage level, thereby assisting said combinatorial means in transitioning the voltage on said output node.

Viewed from a fourth aspect, the present invention provides a computer program storage medium (for example a non-transitory storage medium) storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device incorporating one or more integrated level shifting combinatorial circuits in accordance with the first aspect of the present invention.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Whilst the integrated level shifting combinatorial circuit of the present invention can be used in a variety of situations where a combinatorial operation needs to be performed at a boundary between two voltage domains, for the purposes of the following discussion the example of a boundary between access logic circuitry and an associated array of bit cells within a memory device will be considered.

Figure 2:
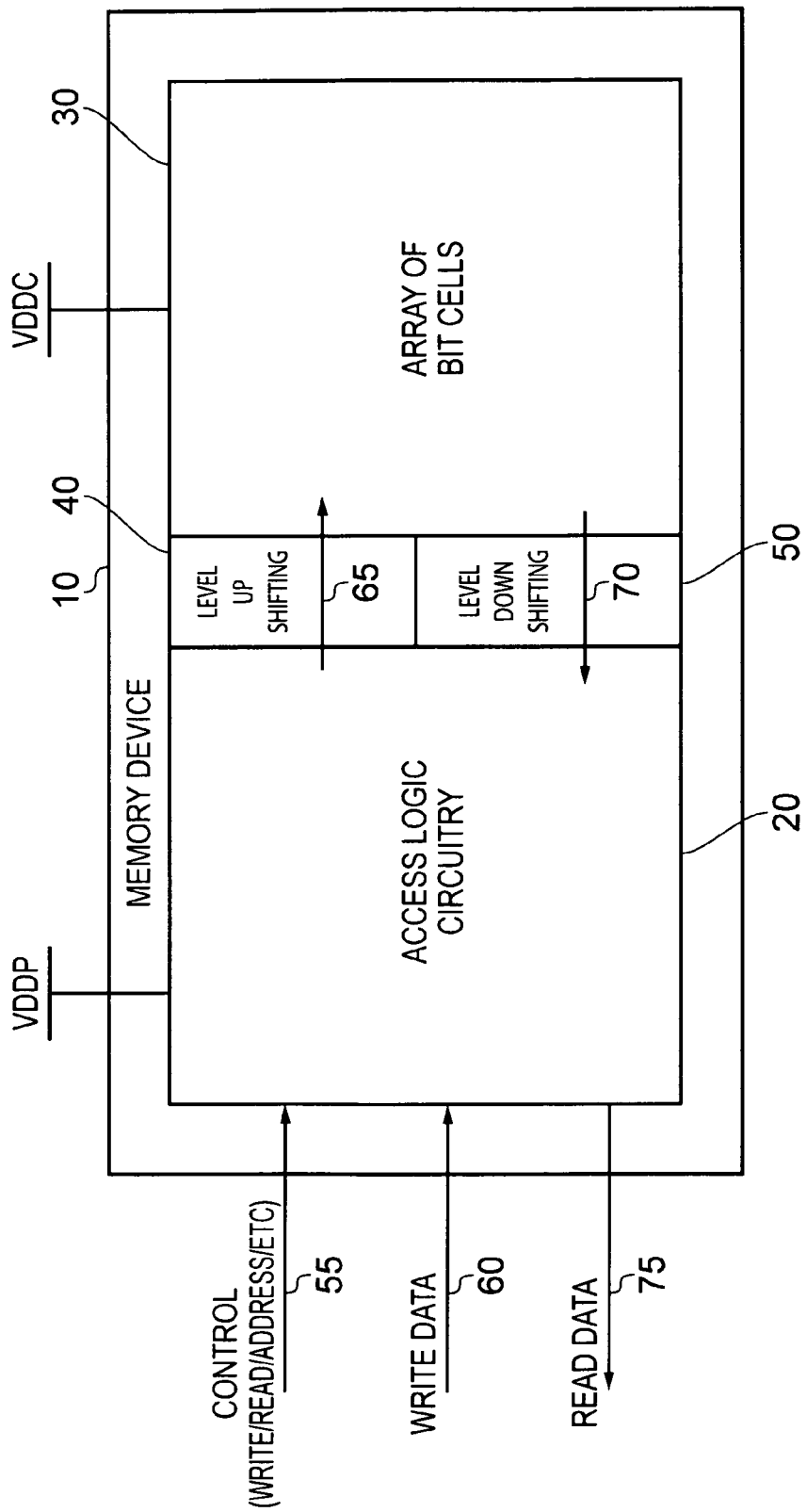
FIG. 2 illustrates an arrangement of a memory device in which the techniques of the described embodiments can be used to perform a level up shifting function.

FIG. 2 is a block diagram schematically illustrating a memory device 10 where the access logic circuitry 20 of the memory device is provided in a first voltage domain operating with a first voltage supply providing a first voltage level VDDP and a ground voltage level (not shown), whilst the array of bit cells 30 is provided in a second voltage domain operating with a second voltage supply providing a second voltage level VDDC and the ground voltage level. The second voltage level VDDC is higher than the first voltage level VDDP. This enables the access logic circuitry 20 to operate with a reduced power consumption, whilst the array of bit cells 30 is operated at a voltage level sufficient to guarantee state retention.

The access logic circuitry 20 will receive a number of control signals over path 55, these control signals identifying write transactions, read transactions, the addresses of those transactions, etc. It will also receive over path 60 write data for write transactions to be performed within the array of bit cells 30, and will output over path 75 the read data resulting from read transactions performed within the array of bit cells 30. As will be understood by those skilled in the art, the access logic circuitry 20 will include a number of components, such as address latches, various stages of word line decoding circuitry to decode the address in order to generate appropriate word line enable signals to activate addressed rows within the array of bit cells 30, write data path logic circuits used to control the voltages on the bit lines within the array of bit cells during a write operation, and various read data path logic circuits for processing the data read out of the array of bit cells in response to a read operation. Accordingly, for write operations, a number of signals will be generated for issuing to the array of bit cells 30 (these signals being schematically illustrated by the arrow 65 in FIG. 1). These signals will need to be subjected to a level up shifting function 40 in order to convert the voltage of those signals from the lower voltage domain to the higher voltage domain. Similarly, any data read out from the bit cells 30 over path 70 during a read operation will need subjecting to a level down shifting function 50 in order to convert the voltage levels from the higher voltage domain to the lower voltage domain, before those signals are then subsequently processed by the access logic circuitry 20.

The level up shifting circuitry 40 is generally more problematic to implement than the level down shifting circuitry 50 (in fact in many instances no specific level down shifting circuitry may be required), since when performing level up shifting there is the potential for establishing various DC paths that can result in significant power consumption, and which may potentially create short circuit current paths.

The integrated level shifting combinatorial circuit of the embodiments described below is particularly suitable for performing the level up shifting functionality in combination with performing a combinatorial operation. Whilst the combinatorial operation can take a variety of forms, the specific example of a decoding operation performed by a word line driver circuit will be considered.

Figure 3:
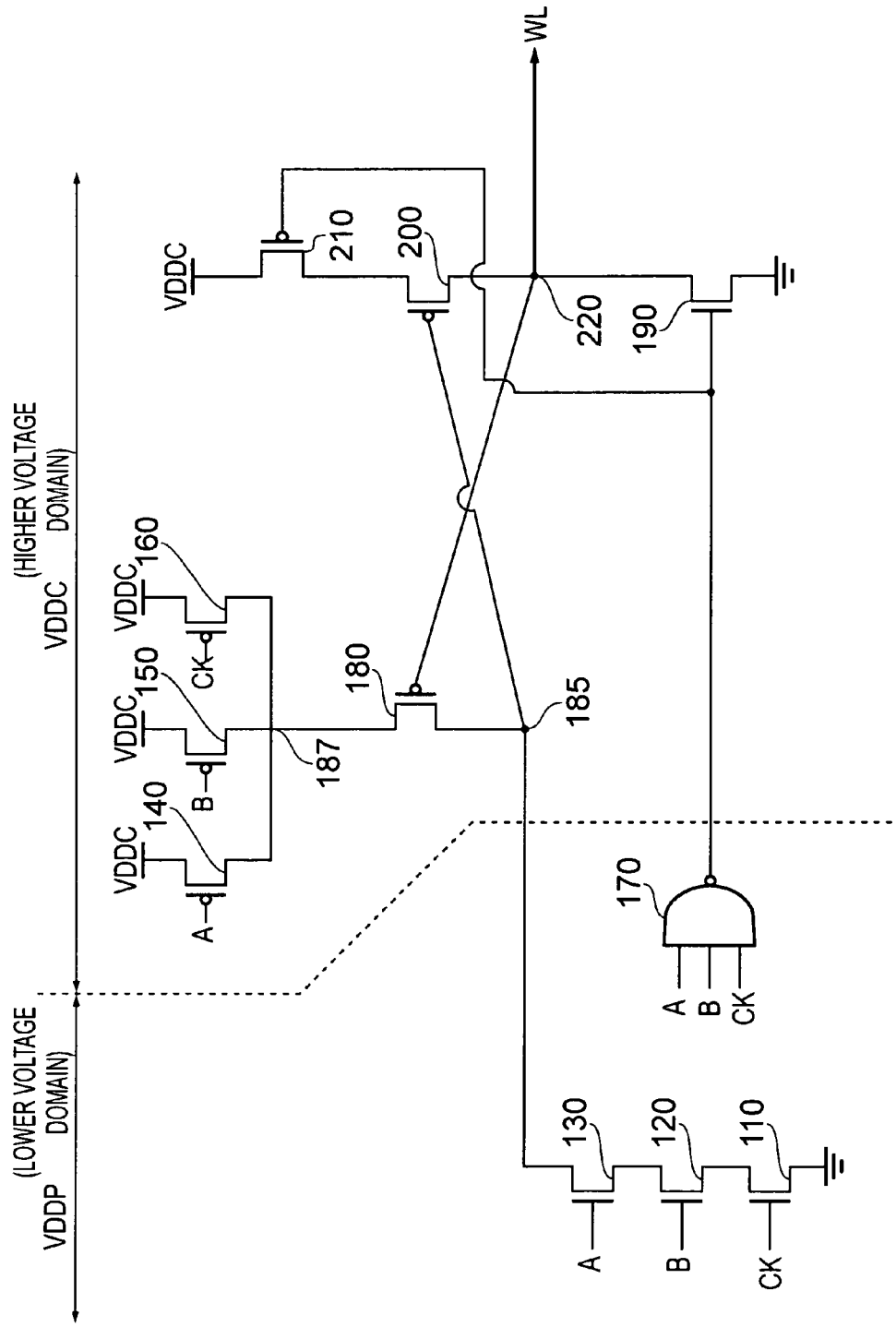
FIG. 3 illustrates an integrated level shifting combinatorial circuit in accordance with one embodiment.

FIG. 3 illustrates an integrated level shifting combinatorial circuit of one embodiment that can be used to provide a word line driver circuit with an integrated level shifting function in accordance with one embodiment. The circuit of FIG. 3 includes combinatorial circuitry used to perform the decoding operation, this including a first combinatorial circuit portion provided within the first voltage domain, referred to in FIG. 3 as the VDDP lower voltage domain, and a second combinatorial circuit portion provided within the second voltage domain, referred to in FIG. 3 as the VDDC higher voltage domain.

The first combinatorial circuit portion is formed by a stack of NMOS transistors 110, 120, 130 and by a small sized NAND gate 170 used to generate a control signal used in the higher voltage domain. The second combinatorial circuit portion includes a plurality of PMOS transistors 140, 150, 160 arranged in parallel, and inverter circuitry formed by the PMOS transistor 200 and NMOS transistor 190. It also includes feedback circuitry formed by the cross-coupled PMOS transistors 180, 200, which serve to perform a level shifting function.

The sequence of PMOS transistors 140, 150, 160 provided in parallel within the VDDC domain cooperate with the NMOS transistor stack 110, 120, 130 provided in the VDDP domain to perform a NAND operation. However, as shown in FIG. 3, the parallel PMOS transistors are separated from the NMOS transistor stack by the PMOS transistor 180.

As mentioned earlier, the PMOS transistor 200 in combination with the NMOS transistor 190 provides an inverter mechanism, although it will be noted that the input to the PMOS transistor 200 is provided over a separate path to the input provided to the NMOS transistor 190. Nevertheless, as will be discussed later with reference to FIGS. 4A and 4B, when the inputs to the NAND gate 170 are causing the NAND gate to output a logic one value, the circuit will operate to transition the node 185 towards the logic one level, and similarly when the inputs to the NAND gate 170 are causing the NAND gate to output a logic zero value, the circuitry formed by the NMOS stack 110, 120, 130 will operate to transition the node 185 towards the logic zero level, and hence it will be appreciated that the PMOS transistor 200 and the NMOS transistor 190 still effectively provide an inverting function.

Whilst the parallel arrangement of PMOS transistors 140, 150, 160 provide part of the decoding functionality, they also form contention mitigation circuitry in combination with the PMOS transistor 210, as will be discussed in more detail later with reference to FIGS. 4A and 4B. The contention mitigation circuitry operates so as to reduce a voltage drop across the relevant one of the PMOS transistors 180, 200 forming the feedback circuitry in situations where the voltage on the output node 220 requires flipping (either from the logic one level to the logic zero level, or from the logic zero level to the logic one level).

Figure 4A:
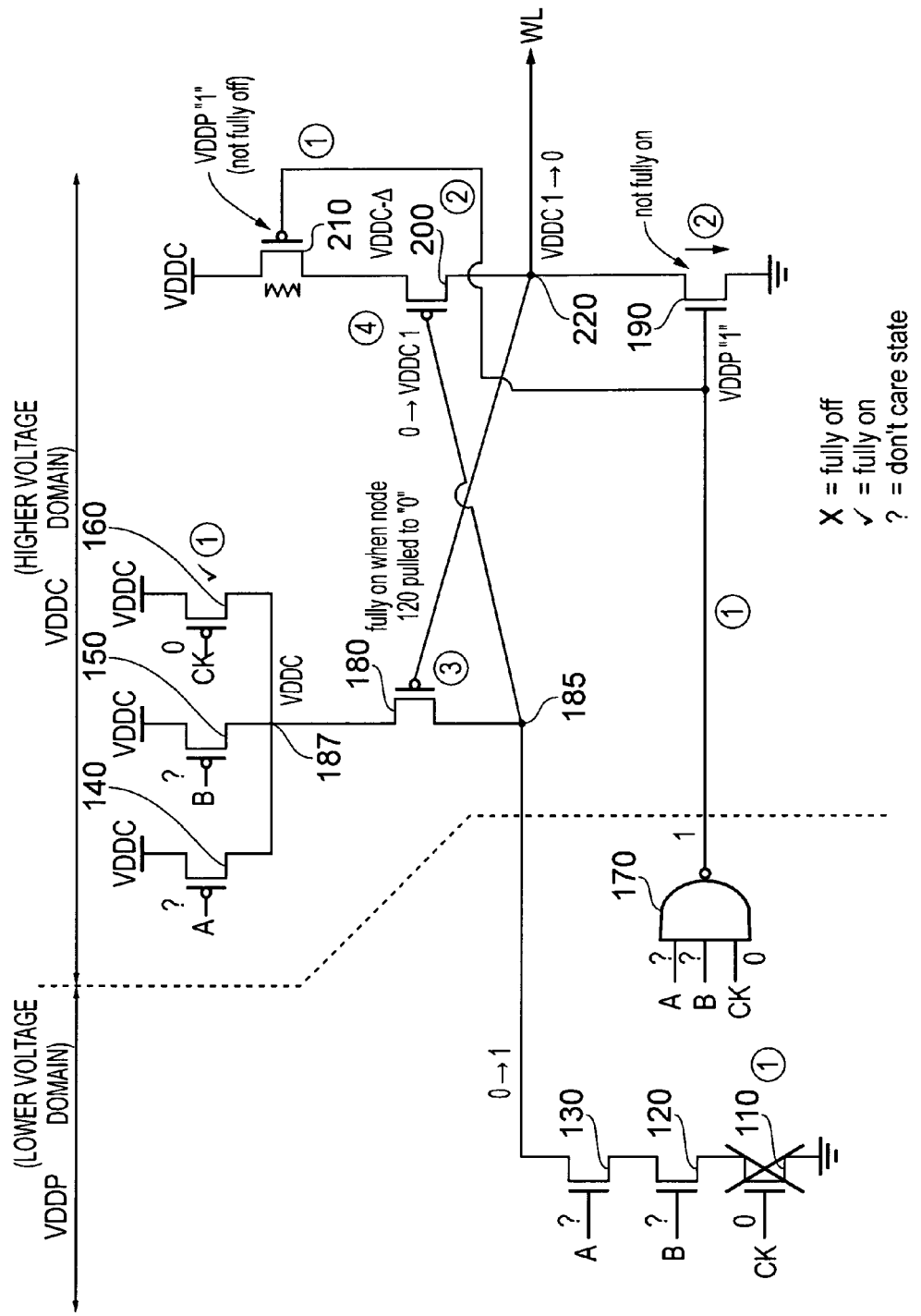
FIGS. 4A and 4B illustrate the operation of the circuit of FIG. 3 in accordance with one embodiment.

FIG. 4A illustrates an example situation where initially the output node 220 is at a logic one level, indicating that the word line is asserted, but, due to change of the input signals, now needs to transition to a logic zero level. In this particular example, it is assumed that the clock signal enters the logic zero phase, hence requiring the asserted word line pulse to be terminated. The numbers provided in circles within FIG. 4A illustrate a general order of events that occurs as a result of the clock signal being set to the logic zero level. In FIG. 4A, the question mark symbol is used to denote a "don't care" state.

As shown, when the clock signal goes to the logic zero level, this will turn off the NMOS transistor 110, and hence irrespective of the values of the signals A and B, the node 185 will be decoupled from the ground potential. At the same time, the logic zero clock input to the NAND gate 170 will cause a logic one value to be output from the NAND gate 170, this logic one value being provided as an input to the NMOS transistor 190 and to the PMOS transistor 210. Furthermore, the logic zero clock signal will turn on the PMOS transistor 160, and hence irrespective of the value of the signals A and B, the node 187 will be connected to the VDDC supply.

Since the logic one output from the NAND gate 170 is in the lower voltage domain, it will not fully turn off the PMOS transistor 210, and accordingly the transistor 210 will provide a resistive path lowering the effective voltage across the PMOS transistor 200, and hence weakening the operation of that PMOS transistor 200. Accordingly, when the NMOS transistor 190 is turned on by the logic one value output from the NAND gate 170 (it will not be fully turned on due to the logic one value being in the lower voltage domain), it will begin to discharge the voltage on the node 220 from the logic one level towards the logic zero level. Whilst initially the PMOS transistor 200 will be receiving a logic zero input, and accordingly will be turned on and hence will be trying to pull the voltage at the node 220 back up towards the logic one level, its operation will be weakened by the presence of the resistive load provided by the PMOS transistor 210, and this will enable the NMOS transistor 190 to overcome the action of the PMOS transistor 200 and pull the voltage at the node 220 down towards the logic zero level.

As the node 220 transitions towards the logic zero level, this will begin to turn on the PMOS transistor 180, which will then pull the node 185 up towards the logic one level within the high voltage domain. As the node 220 reaches the logic 0 level, this will result in the PMOS transistor 180 being fully turned on, and accordingly will cause the node 185 to reach the logic one level in the VDDC domain, this being provided to the gate of the PMOS transistor 200 to hence fully turn that transistor off. At this point, the power consumed by the resistance of the PMOS transistor 210 is terminated. Hence, such a mechanism provides a quick and efficient mechanism for performing a word line voltage transition from the high voltage domain logic one level to the logic zero level.

Figure 4B:
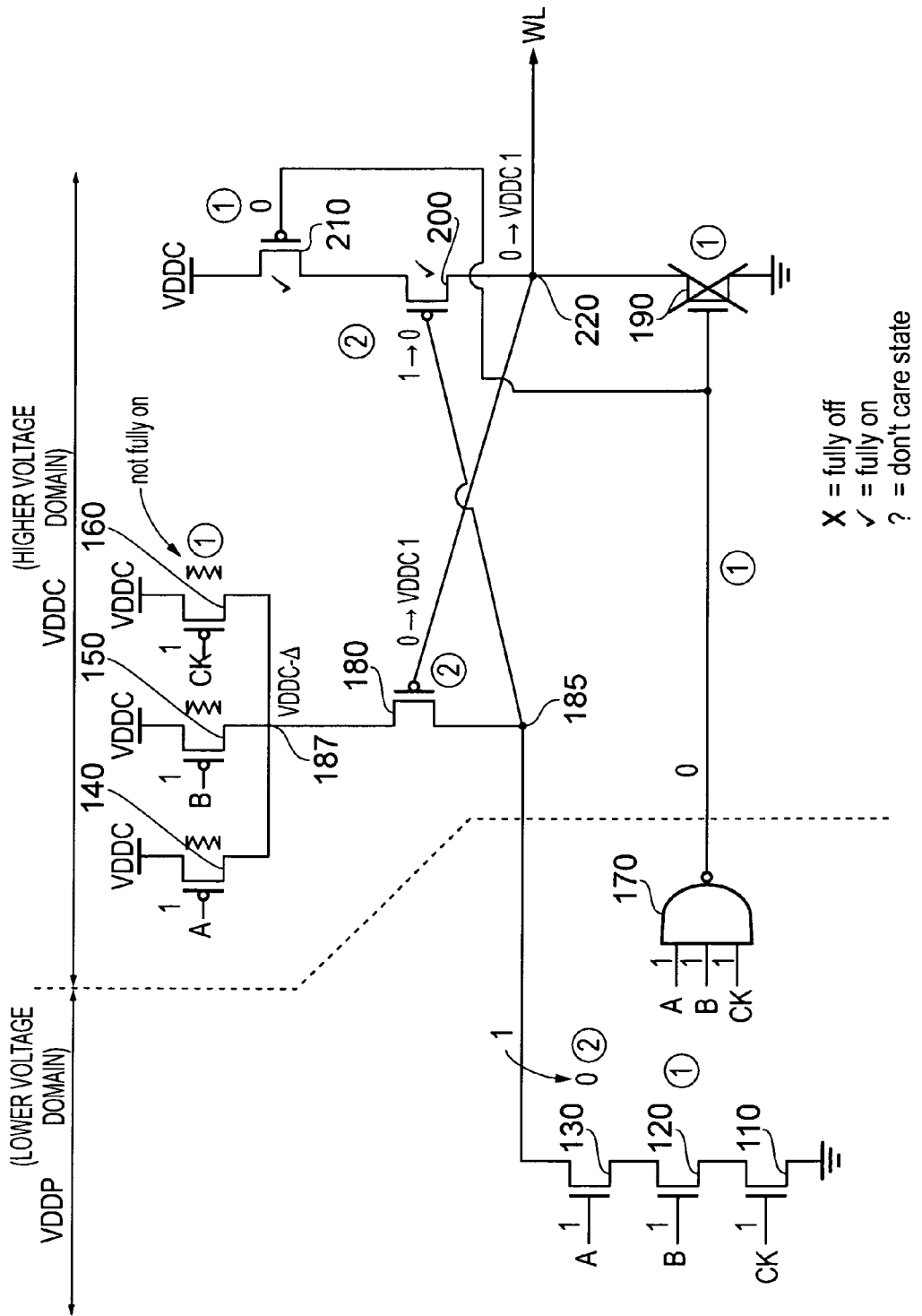

FIG. 4B illustrates an opposite scenario, where the word line output node 220 is originally at the logic zero level, but a change in the input signals requires it to transition to the VDDC logic one level. In particular, at this point, both of the input signals A and B are at the logic one value, and the clock signal is in its high phase. As a result, all of the NMOS transistors 110, 120, 130 within the stack are turned on, and begin to discharge the node 185 towards the logic zero level. The NAND gate 170 outputs a logic zero value, hence turning off the NMOS transistor 190. The logic zero value output by the NAND gate is also provided to the PMOS transistor 210, hence fully turning on that PMOS transistor, thus causing the PMOS transistor 200 to be connected between the VDDC supply and the output node 220. When the NMOS stack starts to discharge the node 185 towards ground, it has to fight against the action of the PMOS transistor 180, which initially is turned on by virtue of the logic zero value on the node 220. However, again the contention mitigation circuitry (this time formed by the PMOS transistors 140, 150, 160) assists in this regard, since all of those PMOS transistors are not fully turned off due to the logic one values at their inputs being generated in the lower voltage domain. They hence provide a high resistance path which lowers the voltage at the node 187, and hence lowers the voltage drop across the PMOS transistor 180, hence weakening the action of the PMOS transistor 180.

This enables the NMOS stack 110, 120, 130 to overcome the action of the PMOS transistor 180, and draw the voltage on the node 185 towards the ground potential. As this happens, the PMOS transistor 200 begins to turn on and hence pulls the node 220 towards the VDDC logic one level. This in turn begins to turn off the PMOS transistor 180. This ultimately results in the PMOS transistor 200 being fully on and the PMOS transistor 180 being fully off, at which point the output node 220 has transitioned to the required VDDC logic one level, and the current drawn through the transistors 140, 150, 160 is terminated.

From the above descriptions of FIGS. 4A and 4B, it will be appreciated that the circuitry avoids any high direct current paths being established during the switching operation, hence reducing power consumption. The use of the contention mitigation circuitry assists in weakening the pull up functionality of the relevant PMOS transistor 180, 200 within the feedback circuitry when it is necessary to switch the voltage at the output node, thereby speeding up the switching operation and again reducing power consumption. The circuit is able to cope with a relatively large difference in voltages between the VDDP voltage domain and the VDDC voltage domain.

Further, a higher strength NMOS stack 110, 120, 130 can be added if desired in order to further boost the differential operation. It is possible to do this in accordance with the design of FIG. 3 without affecting the word line falling time, since the inputs to the PMOS transistor 200 and the NMOS transistor 190 of the word line driver are segregated.

Figure 1:
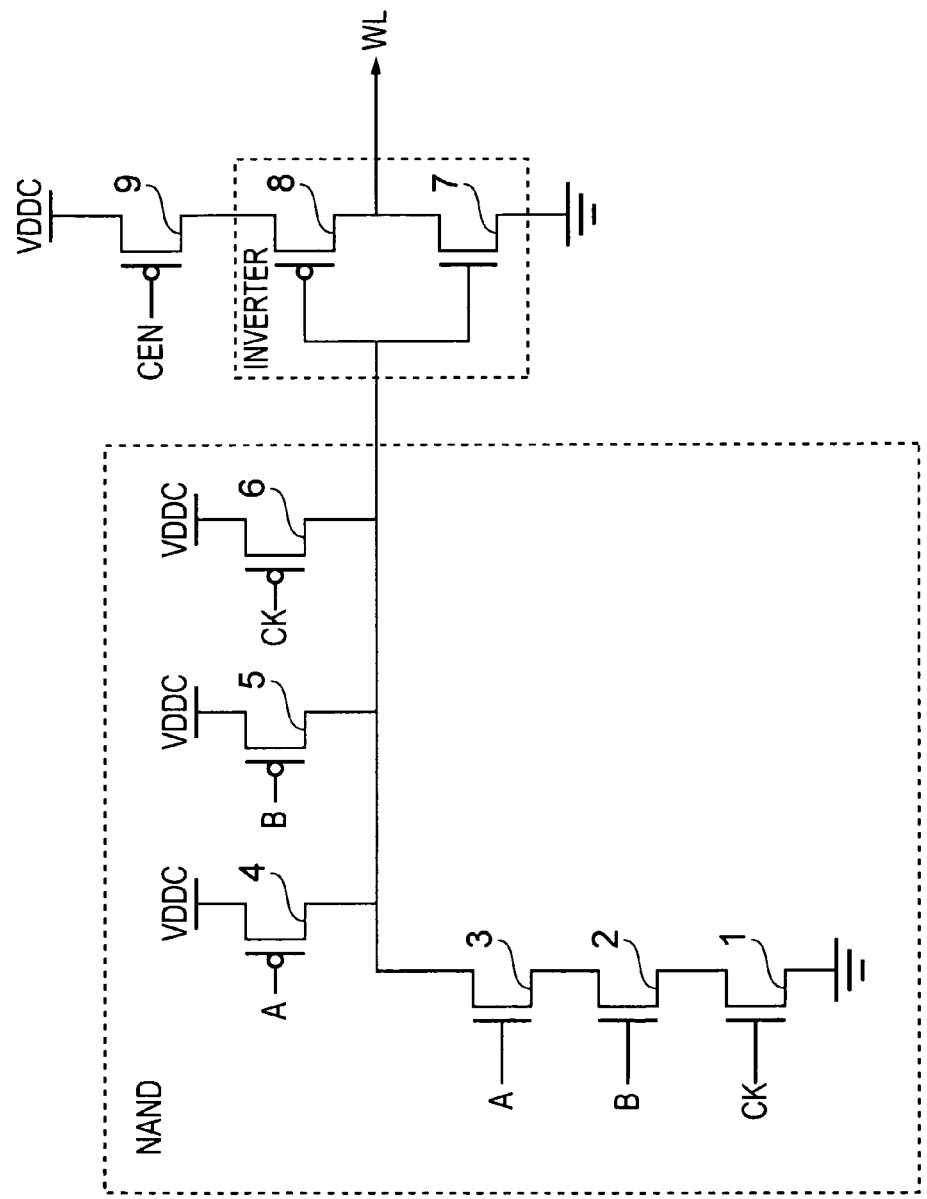
FIG. 1 is a diagram illustrating a known word line driver circuit.

In addition, the circuitry avoids the need for the provision of a separate control header such as the control header transistor 9 required in the prior art arrangement of FIG. 1. This is because the PMOS transistor 210 forming part of the contention mitigation circuitry automatically provides this functionality during any periods of time where the word line driver circuitry is not used, in particular the PMOS transistor 210 serving to reduce leakage current in such situations. Hence, the circuitry provides leakage savings in both quiescent and regular functional modes. It has been found that the circuitry provides a very low delay penalty, even as the voltage difference between the two domains increases.

Figure 5:
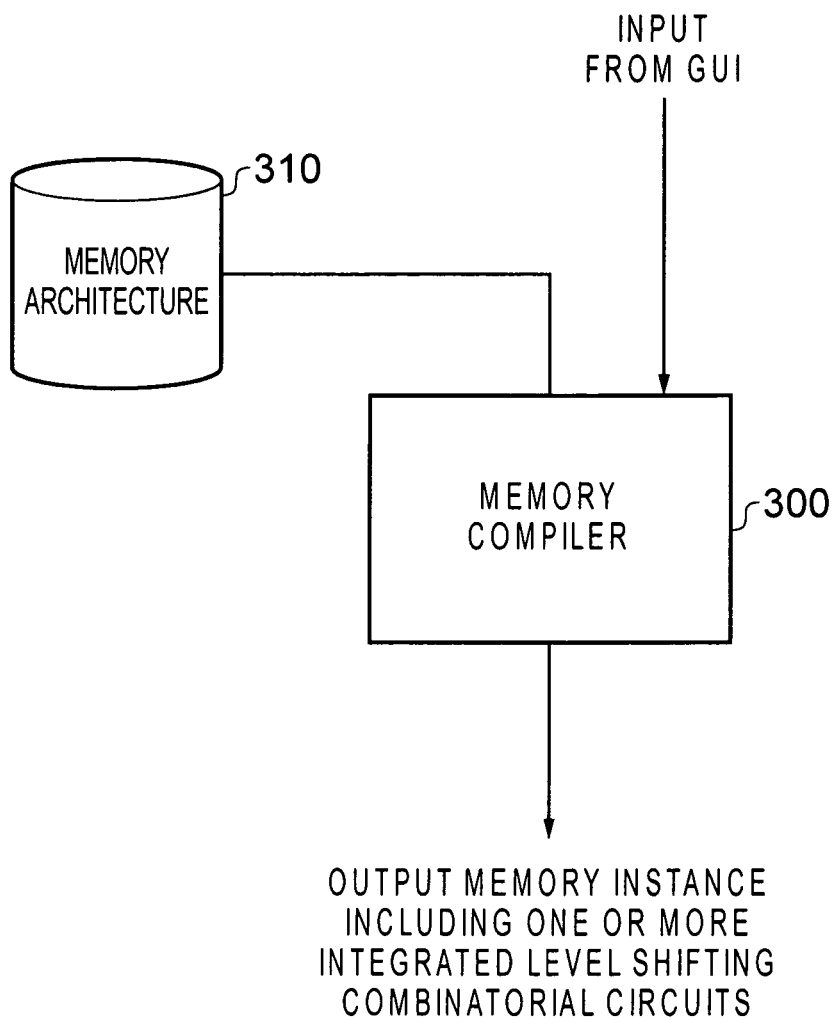
FIG. 5 is a diagram schematically illustrating the operation of a memory compiler to generate a memory instance including one or more integrated level shifting combinatorial circuits of the described embodiments.

FIG. 5 schematically illustrates how a memory instance including one or more integrated level shifting combinatorial circuits in accordance with the above described embodiments may be created from a memory compiler 300 with reference to a memory architecture 310. The memory architecture 310 specifies a definition of circuit elements and data defining rules for combining those circuit elements in order to create a memory instance. Particular requirements for the memory instance are entered into the memory compiler 300 as input parameters via a graphical user interface (GUI). As will be appreciated by those skilled in the art, such input parameters can specify various aspects of the desired memory instance, for example defining the size of the memory array, the multiplexing arrangements of the memory array, selection of various optional features such as power gating features, built-in-self-test (BIST) modes to be supported, etc.

The memory compiler 300 then generates the required memory instance based on the input parameters and the memory architecture 310. In accordance with one embodiment, the memory compiler includes one or more integrated level shifting combinatorial circuits between the access logic circuitry and the array of bit cells within the memory device, each integrated level shifting combinatorial circuit having the form described with reference to the earlier figures.

Figure 6:
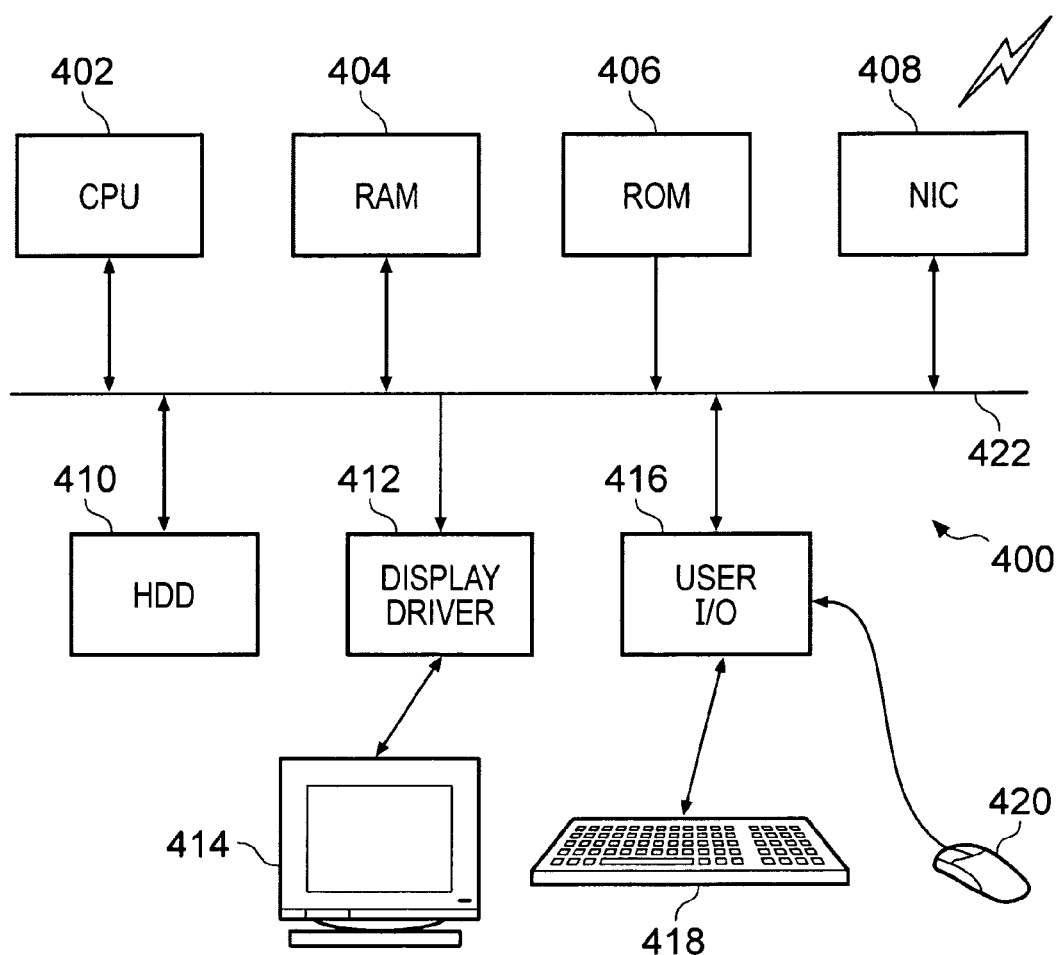
FIG. 6 is a diagram of a computer system on which a memory compiler operation may be performed to generate a memory instance conforming to the above described embodiments.

FIG. 6 schematically illustrates a general purpose computer 400 of the type that may be used to implement the above described memory compilation operation in order to generate a memory instance. The general purpose computer 400 includes a central processing unit 402, a random access memory 404, a read only memory 406, a network interface card 408, a hard disk drive 410, a display driver 412 and monitor 414 and a user input/output circuit 416 with a keyboard 418 and mouse 420 all connected via a common bus 422. In operation the central processing unit 402 will execute computer program instructions that may be stored in one or more of the random access memory 404, the read only memory 406 and the hard disk drive 410 or dynamically downloaded via the network interface card 408. The results of the processing performed may be displayed to a user via the display driver 412 and the monitor 414. User inputs for controlling the operation of the general purpose computer 400 may be received via the user input output circuit 416 from the keyboard 418 or the mouse 420 (and hence for example the input parameters used to determine certain properties of the required memory instance can be entered via this mechanism). It will be appreciated that the computer program could be written in a variety of different computer languages. The computer program may be stored and distributed on a recording medium or dynamically downloaded to the general purpose computer 400. When operating under control of an appropriate computer program, the general purpose computer 400 can perform the above described memory compiler operation and can be considered to form an apparatus for performing the above described memory compiler operation. The architecture of the general purpose computer 400 could vary considerably and FIG. 6 is only one example.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. An integrated level shifting combinatorial circuit for receiving a plurality of input signals in a first voltage domain and performing a combinatorial operation to generate an output signal in a second voltage domain, said first voltage domain operating with a first voltage supply providing a first voltage level and a common voltage level and said second voltage domain operating with a second voltage supply providing a second voltage level and said common voltage level, said integrated level shifting combinatorial circuit comprising:

combinatorial circuitry configured to receive said plurality of input signals and to perform the combinatorial operation, the combinatorial circuitry comprising a first combinatorial circuit portion operating in said first voltage domain and a second combinatorial circuit portion operating in said second voltage domain, the second combinatorial circuit portion having an output node whose voltage level identifies a value of the output signal;

said second combinatorial circuit portion including feedback circuitry configured to apply a level shifting function to an intermediate signal generated by said first combinatorial circuit portion; and contention mitigation circuitry operating in said second voltage domain and configured, when the combinatorial circuitry's performance of the combinatorial operation based on the received input signals causes the combinatorial circuitry to transition the voltage on said output node between said second voltage level and said common voltage level, to reduce a voltage drop across at least one component within the feedback circuitry, thereby assisting said combinatorial circuitry in transitioning the voltage on said output node, wherein said contention mitigation circuitry includes part of said second combinatorial circuit portion, wherein said part of said second combinatorial circuit portion included within said contention mitigation circuit comprises a plurality of PMOS transistor circuits arranged in parallel, each PMOS transistor circuit receiving an associated one of said input signals from the first voltage domain.

2. An integrated level shifting combinatorial circuit as claimed in claim 1, wherein a difference between said second voltage level and said common voltage level is higher than a difference between said first voltage level and said common voltage level.

3. An integrated level shifting combinatorial circuit as claimed in claim 1, wherein said combinatorial circuitry performs a decoding operation.

4. An integrated level shifting combinatorial circuit as claimed in claim 3, wherein the output signal forms a word line driver signal for a row of memory cells within a memory array.

5. An integrated level shifting combinatorial circuit as claimed in claim 1, wherein said plurality of input signals includes a clock signal used to qualify the remaining input signals in said plurality, such that performance of said combinatorial operation by said combinatorial circuitry only enables said output signal to be set to an asserted value when the clock signal is in a predetermined phase.

6. An integrated level shifting combinatorial circuit as claimed in claim 5, wherein said asserted value is indicated by the output node being at said second voltage level, and the predetermined phase of the clock signal occurs when the clock signal is at a logic 1 level.

7. An integrated level shifting combinatorial circuit as claimed in claim 1, wherein said second combinatorial circuit portion includes an inverter circuit whose output forms said output node, and said contention mitigation circuitry further comprises transistor circuitry located between said inverter circuit and one of said second voltage level and said common voltage level, the transistor circuitry receiving at a gate terminal a signal generated by the first combinatorial circuit portion in the first voltage domain.

8. An integrated level shifting combinatorial circuit as claimed in claim 7, wherein said transistor circuitry comprises PMOS transistor circuitry located between said inverter circuit and said second voltage level.

9. An integrated level shifting combinatorial circuit as claimed in claim 8, wherein, when the combinatorial circuitry's performance of the combinatorial operation based on the received input signals causes the combinatorial circuitry to transition the voltage on said output node from said second voltage level to said common voltage level, said PMOS transistor circuitry of the contention mitigation circuitry is driven by a logic 1 signal from said first voltage domain which causes the PMOS transistor circuitry to present a resistive path reducing the voltage across a pull-up component within the inverter circuit.

10. An integrated level shifting combinatorial circuit as claimed in claim 9, wherein said first combinatorial circuit portion includes a NAND gate circuit configured to generate said logic 1 signal from said first voltage domain, said NAND gate circuit additionally configured to provide said logic 1 signal to a pull-down component within the inverter circuit.

11. An integrated level shifting combinatorial circuit as claimed in claim 1, wherein, when the combinatorial circuitry's performance of the combinatorial operation based on the received input signals causes the combinatorial circuitry to transition the voltage on said output node from said common voltage level to said second voltage level, said plurality of PMOS transistor circuits of the contention mitigation circuitry are driven by logic 1 signals from said first voltage domain which cause the plurality of PMOS transistor circuits to present a resistive path reducing the voltage across a pull-up component within the feedback circuitry.

12. An integrated level shifting combinatorial circuit as claimed in claim 1, wherein said first combinatorial circuit portion comprises a stack of NMOS transistor circuits, each NMOS transistor in the stack configured to receive an associated one of said input signals.

13. A method of operating an integrated level shifting combinatorial circuit configured to receive a plurality of input signals in a first voltage domain and to perform a combinatorial operation to generate an output signal in a second voltage domain, said first voltage domain operating with a first voltage supply providing a first voltage level and a common voltage level and said second voltage domain operating with a second voltage supply providing a second voltage level and said common voltage level, said method comprising:
  employing combinatorial circuitry to receive said plurality of input signals and to perform the combinatorial operation, the combinatorial circuitry comprising a first combinatorial circuit portion operating in said first voltage domain and a second combinatorial circuit portion operating in said second voltage domain, the second combinatorial circuit portion having an output node whose voltage level identifies a value of the output signal;
  employing feedback circuitry within said second combinatorial circuit portion to apply a level shifting function to an intermediate signal generated by said first combinatorial circuit portion; and
  employing contention mitigation circuitry operating in said second voltage domain, when the combinatorial circuitry's performance of the combinatorial operation based on the received input signals causes the combinatorial circuitry to transition the voltage on said output node between said second voltage level and said common voltage level, to reduce a voltage drop across at least one component within the feedback circuitry, thereby assisting said combinatorial circuitry in transitioning the voltage on said output node, wherein said contention mitigation circuitry includes part of said second combinatorial circuit portion, wherein said part of said second combinatorial circuit portion included within said contention mitigation circuitry comprises a plurality of PMOS transistor circuits arranged in parallel, each PMOS transistor circuit receiving an associated one of said input signals from the first voltage domain.

14. An integrated level shifting combinatorial circuit for receiving a plurality of input signals in a first voltage domain and performing a combinatorial operation to generate an output signal in a second voltage domain, said first voltage domain operating with a first voltage supply providing a first voltage level and a common voltage level and said second voltage domain operating with a second voltage supply providing a second voltage level and said common voltage level, said integrated level shifting combinatorial circuit comprising:
  combinatorial means for receiving said plurality of input signals and for performing the combinatorial operation, the combinatorial means comprising a first combinatorial circuit portion means for operating in said first voltage domain and a second combinatorial circuit portion means for operating in said second voltage domain, the second combinatorial circuit portion means having an output node whose voltage level identifies a value of the output signal;
  said second combinatorial circuit portion means including feedback means for applying a level shifting function to an intermediate signal generated by said first combinatorial circuit portion means; and
  contention mitigation means for operating in said second voltage domain and for reducing a voltage drop across at least one component within the feedback means when performance by the combinatorial means of the combinatorial operation based on the received input signals causes the combinatorial means to transition the voltage on said output node between said second voltage level and said common voltage level, thereby assisting said combinatorial means in transitioning the voltage on said output node, wherein said contention mitigation means includes part of said second combinatorial circuit portion means, wherein said part of said second combinatorial circuit portion means included within said contention mitigation means comprises a plurality of PMOS transistor circuits arranged in parallel, each PMOS transistor circuit receiving an associated one of said input signals from the first voltage domain.

15. A computer program storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device incorporating an integrated level shifting combinatorial circuit as claimed in claim 1.

* * * * *